United States Patent
Yuan et al.

(10) Patent No.: US 10,756,126 B2
(45) Date of Patent: Aug. 25, 2020

(54) FLEXIBLE DISPLAY PANEL AND MANUFACTURING METHOD THEREOF

(71) Applicant: Kunshan New Flat Panel Display Technology Center Co., Ltd., Kunshan (CN)

(72) Inventors: Bo Yuan, Kunshan (CN); Genmao Huang, Kunshan (CN); Zhiyuan Cui, Kunshan (CN); Kun Hu, Kunshan (CN); Lin Xu, Kunshan (CN); Bo Li, Kunshan (CN)

(73) Assignee: Kunshan New Flat Panel Display Technology Center Co., Ltd., Kunshan (CN)

( * ) Notice: Subject to any disclaimer, the term of this patent is extended or adjusted under 35 U.S.C. 154(b) by 45 days.

(21) Appl. No.: 16/355,407

(22) Filed: Mar. 15, 2019

(65) Prior Publication Data

US 2019/0214412 A1    Jul. 11, 2019

Related U.S. Application Data

(63) Continuation of application No. PCT/CN2018/088107, filed on May 24, 2018.

(30) Foreign Application Priority Data

Aug. 31, 2017 (CN) .......................... 2017 1 0773133

(51) Int. Cl.
  *H01L 27/15* (2006.01)
  *H01L 29/26* (2006.01)
  (Continued)

(52) U.S. Cl.
  CPC ........ *H01L 27/1262* (2013.01); *H01L 27/124* (2013.01); *H01L 27/1218* (2013.01);
  (Continued)

(58) Field of Classification Search
  CPC ......... H01L 51/0097; H01L 2251/5338; H01L 27/3244; H01L 2251/558; H01L 27/1244; H01L 21/02107; H01L 23/5387
  (Continued)

(56) References Cited

U.S. PATENT DOCUMENTS 9,450,038 B2    9/2016 Kwon et al.
2015/0268775 A1    9/2015 Yu et al.
(Continued)

FOREIGN PATENT DOCUMENTS

CN    104485351 A    4/2015
CN    104934438 A    9/2015
(Continued)

OTHER PUBLICATIONS

PCT International Search Report dated Jul. 18, 2018 in International Application No. PCT/CN2018/088107, Includes English Translation. 6 pages.
(Continued)

*Primary Examiner* — S. V. Clark

(57) ABSTRACT

The present application provides a flexible display panel and a manufacturing method thereof. The flexible display panel includes a flexible substrate, a buffer layer formed on the flexible substrate, and a metal layer formed on the buffer layer. The flexible display panel includes a display area and a bending area in a lateral direction. The buffer layer includes a first portion and a second portion, the first portion corresponding to the display area, the second portion corresponding to the bending area, and the thickness of the second portion is less than the thickness of the first portion.

20 Claims, 3 Drawing Sheets

(51) Int. Cl.
  *H01L 31/12* (2006.01)
  *H01L 27/12* (2006.01)
  *H01L 27/32* (2006.01)
  *H01L 21/311* (2006.01)
(52) U.S. Cl.
  CPC ...... *H01L 27/1248* (2013.01); *H01L 27/3244* (2013.01); *H01L 21/31105* (2013.01)
(58) Field of Classification Search
  USPC ...... 257/79, 80, 81, 431, 432; 438/7, 25, 26, 438/30
  See application file for complete search history.

(56) References Cited

U.S. PATENT DOCUMENTS

| | | | | |
|---|---|---|---|---|
| 2019/0245157 A1* | 8/2019 | Chung | .................... | H01L 51/56 |
| 2020/0097116 A1* | 3/2020 | Choi | ..................... | G06F 3/0412 |
| 2020/0127220 A1* | 4/2020 | Kim | ..................... | H01L 27/3248 |
| 2020/0127229 A1* | 4/2020 | Noh | .................... | H01L 51/5237 |
| 2020/0152707 A1* | 5/2020 | Won | ..................... | G06F 3/0412 |
| 2020/0168675 A1* | 5/2020 | Kim | ..................... | G06F 3/0412 |
| 2020/0168695 A1* | 5/2020 | Moon | ................ | H01L 27/1244 |

FOREIGN PATENT DOCUMENTS

| | | | |
|---|---|---|---|
| CN | 105144418 | A | 12/2015 |
| CN | 106601133 | A | 4/2017 |
| CN | 106796364 | A | 5/2017 |
| CN | 106848108 | A | 6/2017 |
| WO | 2014126403 | A1 | 8/2018 |

OTHER PUBLICATIONS

European Search Report in European Application No. 18850546.5 dated Mar. 20, 2020.
Written Opinion of PCT/CN2018/088107 dated Jul. 18, 2018.
Chinese First Office Action for CN Application No. 201710773133.6 dated May 21, 2019.
Chinese Second Office Action for CN Application No. 201710773133.6 dated Jul. 8, 2019.

* cited by examiner

FLEXIBLE DISPLAY PANEL AND MANUFACTURING METHOD THEREOF

CROSS-REFERENCE TO RELATED APPLICATIONS

This application is a continuation of International Application No. PCT/CN2018/088107 filed on May 24, 2018, which claims priority to Chinese Patent Application No. 201710773133.6, filed on Aug. 31, 2017. Both applications are incorporated herein by reference in their entireties.

TECHNICAL FIELD

The present application relates to the field of display technologies, and in particularly to a flexible display panel and a manufacturing method thereof.

BACKGROUND

A flexible foldable display, such as an Organic Light Emitting Display (OLED), may provide users with new visual experience. However, after repeated bending of the display, a problem of metal lines breakage is easily generated, thereby affecting displaying.

A current solution is to protect the metal lines by adopting an insulating layer/metal layer/insulating layer/planarization layer structure. However, the Young's modulus of the insulating layer is large, and a breakage is easily generated when bending, resulting in the metal lines breakage.

SUMMARY

Embodiments of the present application provide a flexible display panel and a manufacturing method thereof, which may improve the bending ability of the flexible display panel.

A first aspect of the present application provides a flexible display panel, including: a flexible substrate; a buffer layer formed on the flexible substrate; and a metal layer formed on the buffer layer. The flexible display panel includes a display area and a bending area in a lateral direction. The buffer layer includes a first portion and a second portion, the first portion corresponds to the display area, the second portion corresponds to the bending area, and a thickness of the second portion is less than a thickness of the first portion.

In an embodiment, the first portion includes a first $SIO_x$ layer, a SINx layer and a second $SIO_x$ layer successively disposed. The first $SIO_x$ layer is disposed on the flexible substrate, and the second portion includes the first $SIO_x$ layer.

In an embodiment, the flexible display panel further includes a planarization layer and a passivation layer formed between the planarization layer and the metal layer. The passivation layer and the planarization layer are made of organic materials, and the buffer layer is made of an inorganic insulating material.

In an embodiment, the second portion of the buffer layer does not include the SINx layer or the second $SIO_x$ layer.

In an embodiment, a thickness of the first $SIO_x$ layer of the second portion is less than or equal to a thickness of the first $SIO_x$ layer of the first portion.

In an embodiment, the flexible display panel further includes a transition area in the lateral direction, and the transition area is located between the display area and the bending area. The buffer layer further includes a third portion corresponding to the transition area, and the third portion gradually decreases in width in a direction from the flexible substrate toward the metal layer.

In an embodiment, the thickness of the first portion is from 300 nm to 1400 nm, and the thickness of the second portion is from 10 nm to 100 nm.

In an embodiment, the thickness of the second portion is from 10 nm to 30 nm.

In an embodiment, a thickness of the third portion is from 300 nm to 700 nm.

In an embodiment, the metal layer comprises metal lines.

A second aspect of the present application provides a manufacturing method of a flexible display panel including a display area and a bending area in a lateral direction. The method includes: providing a flexible substrate; forming a buffer layer on the flexible substrate; defining the portion of the buffer layer corresponding to the display area as a first portion, etching the portion of the buffer layer corresponding to the bending area to obtain a second portion, and making a thickness of the second portion to be less than a thickness of the first portion and forming a metal layer on the buffer layer.

In an embodiment, the forming a buffer layer on the flexible substrate includes: forming a first $SIO_x$ layer, a SINx layer and a second $SIO_x$ layer successively on the flexible substrate. The etching the portion of the buffer layer corresponding to the bending area to obtain a second portion includes: etching the second $SIO_x$ layer and the SINx layer of the buffer layer corresponding to the bending area to expose a first $SIO_x$ layer of the second portion.

In an embodiment, after the etching the second $SIO_x$ layer and the SINx layer of the buffer layer corresponding to the bending area to expose a first $SIO_x$ layer of the second portion, the method further comprises: further etching the first $SIO_x$ layer of the second portion, till a thickness of the first $SIO_x$ layer of the second portion is less than or equal to a thickness of the first $SIO_x$ layer of the first portion.

In an embodiment, the flexible display panel further includes a transition area in the lateral direction, and the transition area is located between the display area and the bending area. The method further includes: etching the portion of the buffer layer corresponding to the transition area to obtain a third portion, and the third portion gradually decreases in width in a direction from the flexible substrate toward the metal layer.

In an embodiment, the thickness of the second portion is from 10 nm to 30 nm.

In an embodiment, the method further includes: forming a passivation layer on the metal layer, and forming a planarization layer on the passivation layer.

In an embodiment, the passivation layer and the planarization layer are made of organic materials, and the buffer layer is made of an inorganic insulating material.

In an embodiment, a thickness of the third portion is from 300 nm to 700 nm.

In an embodiment, the metal layer comprises metal lines.

In the manufacturing method of a flexible display panel according to the embodiments of the present application, the thickness of the buffer layer of the bending area is less than the thickness of the buffer layer of the display area by etching the buffer layer of the bending area before forming the metal layer, and thereby the bending ability of the flexible display panel is improved.

DETAILED DESCRIPTION

A clear and complete description of technical solutions in the embodiments of the present application will be given below, in combination with the accompanying drawings in the embodiments of the present application. Apparently, the described embodiments are a part of the embodiments of the present application, but not all of the embodiments. All other embodiments, obtained by those skilled in the art based on the embodiments of the present application without creative efforts, shall fall within the protection scope of the present application.

Figure 1:
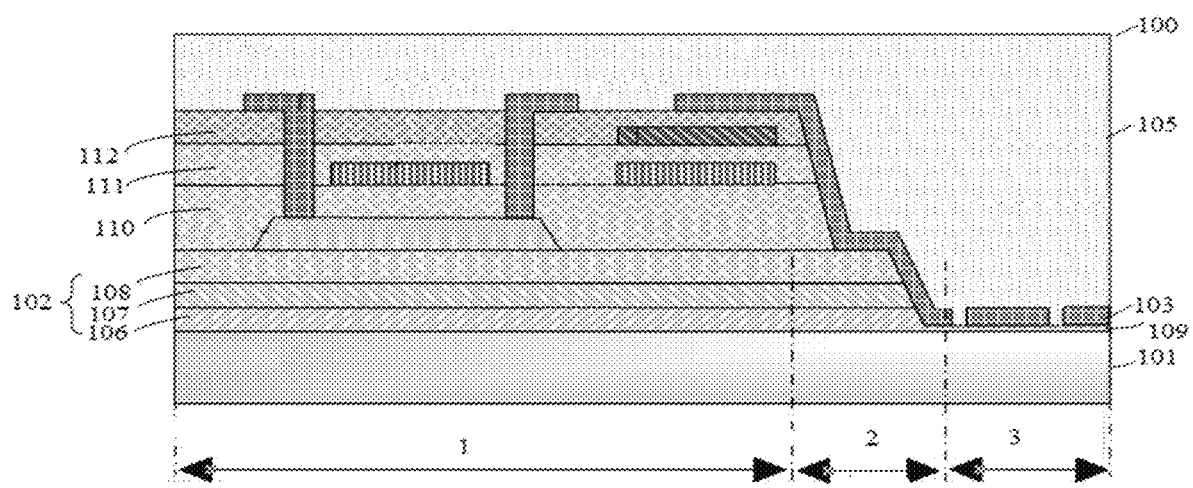
FIG. 1 is a schematic sectional view of a flexible display panel according to an embodiment of the present application.

FIG. 1 is a schematic sectional view of a flexible display panel 100 according to an embodiment of the present application.

The flexible display panel 100 includes: a flexible substrate 101, a buffer layer 102 formed on the flexible substrate 101, and a metal layer 103 formed on the buffer layer 102. The flexible display panel 100 includes a display area 1 and a bending area 3 in a lateral direction. The buffer layer 102 includes a first portion and a second portion, the first portion corresponds to the display area 1, the second portion corresponds to the bending area 3, and the thickness of the second portion is less than the thickness of the first portion.

According to embodiments of the present application, the thickness of the buffer layer of the bending area is less than the thickness of the buffer layer of the display area by etching the buffer layer of the bending area before forming the metal layer, and thereby the bending ability of the flexible display panel is improved.

According to embodiments of the present application, the first portion of the buffer layer 102 may include a first $SIO_x$ layer 106, a SINx layer 107 and a second $SIO_x$ layer 108 that are successively disposed, and the second portion of the buffer layer 102 includes a first $SIO_x$ layer, and does not include a SINx layer or a second $SIO_x$ layer.

Referring to FIG. 1, in the display area of the flexible display panel, the buffer layer may include the first $SIO_x$ layer 106, the SINx layer 107, and the second $SIO_x$ layer 108 (i.e., the first portion) that are successively disposed from bottom to top. In the bending area of the flexible display panel, the buffer layer may include a first $SIO_x$ layer 109 (i.e., the second portion) that is remained by removing the SINx layer and the second $SIO_x$ layer. The first $SIO_x$ layer 106 and the first $SIO_x$ layer 109 are on the same layer.

It should be understood that the first portion of the buffer layer 102 may include at least one layer of the first $SIO_x$ layer, the SINx layer and the second $SIO_x$ layer, and embodiments of the present application are not limited to a setting sequence of each layer. Alternatively, the buffer layer 102 may also be other silicon compounds or other materials that may be used for the buffer layer.

Further, the thickness of the first $SIO_x$ layer 109 of the second portion is less than or equal to the thickness of the first $SIO_x$ layer 106 of the first portion. For example, the thickness of the first portion may be from 300 nm to 1400 nm. The thickness of the second portion may be from 10 nm to 100 nm.

Preferably, the thickness of the second portion may be 10 nm to 30 nm.

Optionally, as another embodiment, a flexible display panel 100 further includes a planarization layer 105.

For example, the flexible display panel 100 includes a flexible substrate 101, a buffer layer 102, a metal layer 103 and a planarization layer 105 that are successively formed on the flexible substrate 101. The thickness of the buffer layer of the bending area is less than the thickness of the buffer layer of the display area. The planarization layer 105 may be made of an organic material. The buffer layer 102 may be made of, for example, an inorganic insulating material. For example, the inorganic insulating material may be an inorganic silicon material, and specifically may be silicon nitride, silicon oxide or the like. In general, when the inorganic silicon material is used for the buffer layer, for example, metal lines breakage in the metal layer is easily caused when the flexible display panel is bent. In general, the thinner the thickness of the buffer layer of the bending area, the stronger the bending ability of the metal layer of the bending area. When the thickness of the buffer layer of the bending area is very small, the metal layer of the bending area is located between organic layers, and a risk of the metal layer of the bending area being broken is greatly reduced when being bent. The bending ability of a bending area of a flexible screen body may be increased by reducing the thickness of the buffer layer of the bending area.

Optionally, as another embodiment, a flexible substrate 101 further includes a transition area 2 in a lateral direction. The transition area 2 is located between a display area 1 and a bend area 3. A buffer layer 102 further includes a third portion, which corresponds to the transition area 2, and gradually decreases in width in a direction from the flexible substrate 101 toward a metal layer 103. The thickness of the third portion is from 300 nm to 700 nm. A role of the transition area 2 is to reduce a risk of lines breakage when the metal layer climbs a slope, and the thickness of the third portion is thinned in order to reduce a risk of lines breakage when the metal layer is bent.

According to embodiments of the present application, the metal layer 103 may be the metal lines.

Figure 2:
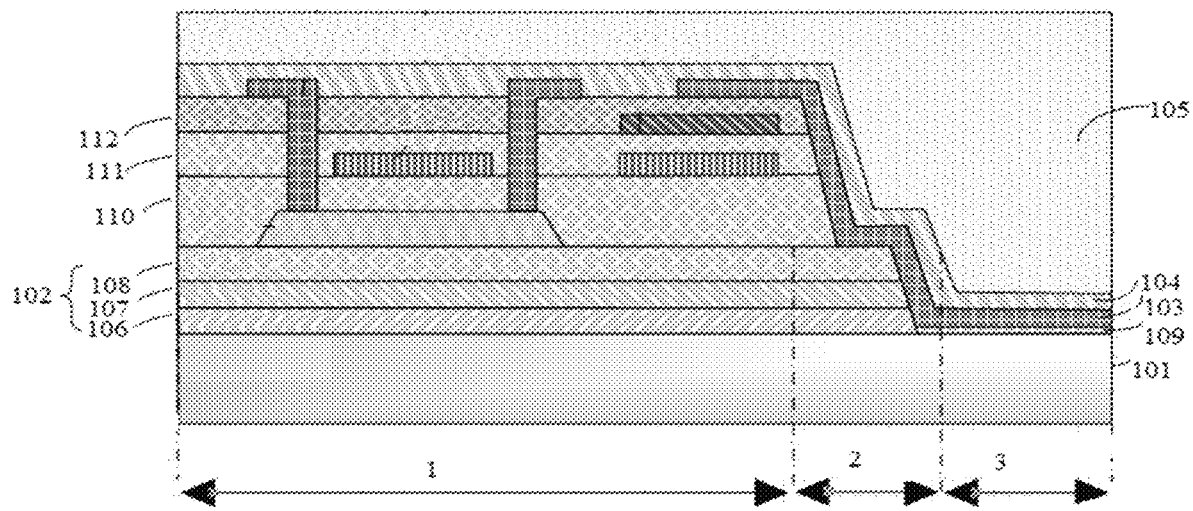
FIG. 2 is a sectional view of a flexible display panel according to another embodiment of the present application.

FIG. 2 is a sectional view of a flexible display panel 200 according to another embodiment of the present application. The flexible display panel 100 includes a flexible substrate 101; a buffer layer 102 formed on the flexible substrate 101; and a metal layer 103, a passivation layer 104 and the planarization layer 105 formed on the buffer layer 102, and the passivation layer 104 is disposed between the planarization layer 105 and the metal layer 103. The flexible display panel 100 includes a display area 1 and a bending area 3 in a lateral direction. The buffer layer 102 includes a first portion and a second portion, the first portion corresponding to the display area 1, the second portion corresponding to the bending area 3, and the thickness of the second portion is less than the thickness of the first portion.

According to embodiments of the present application, the thickness of the buffer layer of the bending area is less than the thickness of the buffer layer of the display area by etching the buffer layer of the bending area before forming the metal layer, and thereby the bending ability of the flexible display panel is improved.

According to embodiments of the present application, the first portion of the buffer layer 102 may include a first $SIO_x$ layer 106, a SINx layer 107 and a second $SIO_x$ layer 108 that are successively disposed, and the second portion of the buffer layer 102 includes a first $SIO_x$ layer, and does not include a SINx layer or a second $SIO_x$ layer.

Referring to FIG. 2, in the display area of the flexible display panel, the buffer layer may include the first $SIO_x$ layer 106, the SINx layer 107 and the second $SIO_x$ layer 108 (i.e., a first portion) that are successively disposed from bottom to top. In the bending area of the flexible display panel, the buffer layer may include a first $SIO_x$ layer 109 (i.e., the second portion) that is remained by removing the SINx layer and the second $SIO_x$ layer. The first $SIO_x$ layer 106 and the first $SIO_x$ layer 109 are on the same layer.

It should be understood that the first portion of the buffer layer 102 may include at least one layer of the first $SIO_x$ layer, the SINx layer and the second $SIO_x$ layer, and embodiments of the present application are not limited to a setting sequence of each layer. Alternatively, the buffer layer 102 may also be other silicon compounds or other materials that may be used for the buffer layer.

Further, the thickness of the first $SIO_x$ layer 109 of the second portion is less than or equal to the thickness of the first $SIO_x$ layer 106 of the first portion. For example, the thickness of the first portion may be from 300 nm to 1400 nm. The thickness of the second portion may be from 10 nm to 100 nm.

Preferably, the thickness of the second portion is from 10 nm to 30 nm.

Optionally, as another embodiment, a flexible substrate 101 further includes a transition area 2 in the lateral direction. The transition area 2 is located between a display areal and a bending area 3. A buffer layer 102 further includes a third portion, which corresponds to the transition area 2, and gradually decreases in width in a direction from the flexible substrate 101 toward a metal layer 103. The thickness of the third portion is from 300 nm to 700 nm. A role of the transition area 2 is to reduce a risk of lines breakage when the metal layer climbs a slope. And the thickness of the third part is thinned in order to reduce a risk of lines breakage when the metal layer is bent.

According to embodiments of the present application, the metal layer 103 may be metal lines.

The passivation layer 104 and the planarization layer 105 may be made of organic materials. The buffer layer 102 may be made of, for example, an inorganic insulating material. For example, the inorganic insulating material may be inorganic silicon material, and specifically may be silicon nitride, silicon oxide or the like. In general, when the inorganic silicon material is used for the buffer layer, for example, metal lines breakage in the metal layer is easily caused when the flexible display panel is bent. In general, the thinner the thickness of the buffer layer of the bending area, the stronger the bending ability of the metal layer of the bending area. When the thickness of the buffer layer of the bending area is very small, the metal layer of the bending area is located between organic layers, and a risk of the metal layer of the bending area being broken is greatly reduced when being bent. The bending ability of the bending area of a flexible screen body may be increased by reducing the thickness of the buffer layer of the bending area.

Figure 3:
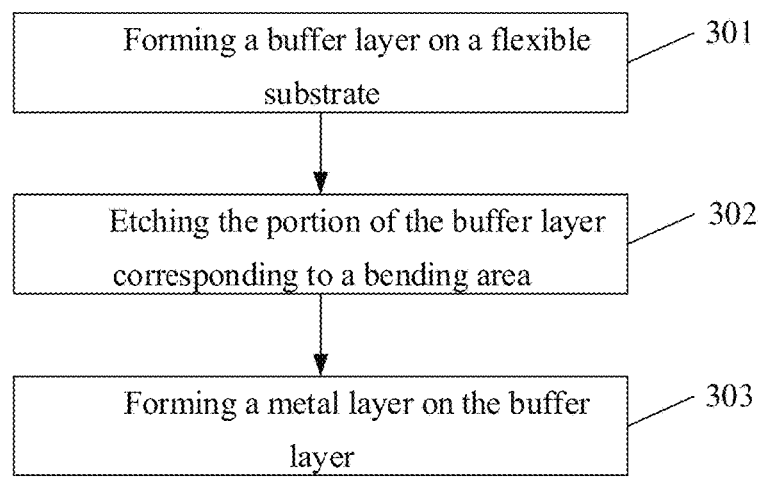
FIG. 3 is a schematic flow chart of a manufacturing method of a flexible display panel according to an embodiment of the present application.

FIG. 3 is a schematic flow chart of a manufacturing method of a flexible display panel according to an embodiment of the present application. The flexible display panel includes a display area and a bending area in a lateral direction. The manufacturing method of FIG. 3 is configured to prepare the flexible display panel of the embodiments of FIG. 1 and FIG. 2. The manufacturing method of FIG. 3 includes the following contents.

301: forming a buffer layer on a flexible substrate.

302: etching the portion of the buffer layer corresponding to the bending area to obtain a second portion, the portion of the buffer layer corresponding to a display area is used as a first portion, and the thickness of the second portion is less than the thickness of the first portion.

303: forming a metal layer on the buffer layer.

According to embodiments of the present application, the thickness of the buffer layer of the bending area is less than the thickness of the buffer layer of the display area by etching the buffer layer of the bending area before forming the metal layer, and thereby the bending ability of the flexible display panel is improved.

According to embodiments of the present application, a first $SIO_x$ layer, a SINx layer and a second $SIO_x$ layer may be formed on the flexible substrate successively when the buffer layer is formed, and the second $SIO_x$ layer and the SINx layer of the buffer layer corresponding to the bending area may be etched to expose a first $SIO_x$ layer of the second portion.

Optionally, as another embodiment, a first $SIO_x$ layer of a second portion may be further etched when a buffer layer is formed, till the thickness of the first $SIO_x$ layer of the second portion is less than or equal to the thickness of a first $SIO_x$ layer of a first portion.

In an embodiment, a flexible display panel further includes a transition area in a lateral direction, and the transition area is located between a display area and a bending area. The manufacturing method of FIG. 3 further includes: etching the portion of a buffer layer corresponding to the transition area to obtain a third portion which gradually decreases in width in a direction from a flexible substrate toward a metal layer.

According to embodiments of the present application, the thickness of the second portion is from 10 nm to 30 nm.

According to embodiments of the present application, the metal layer includes metal lines.

Figure 4:
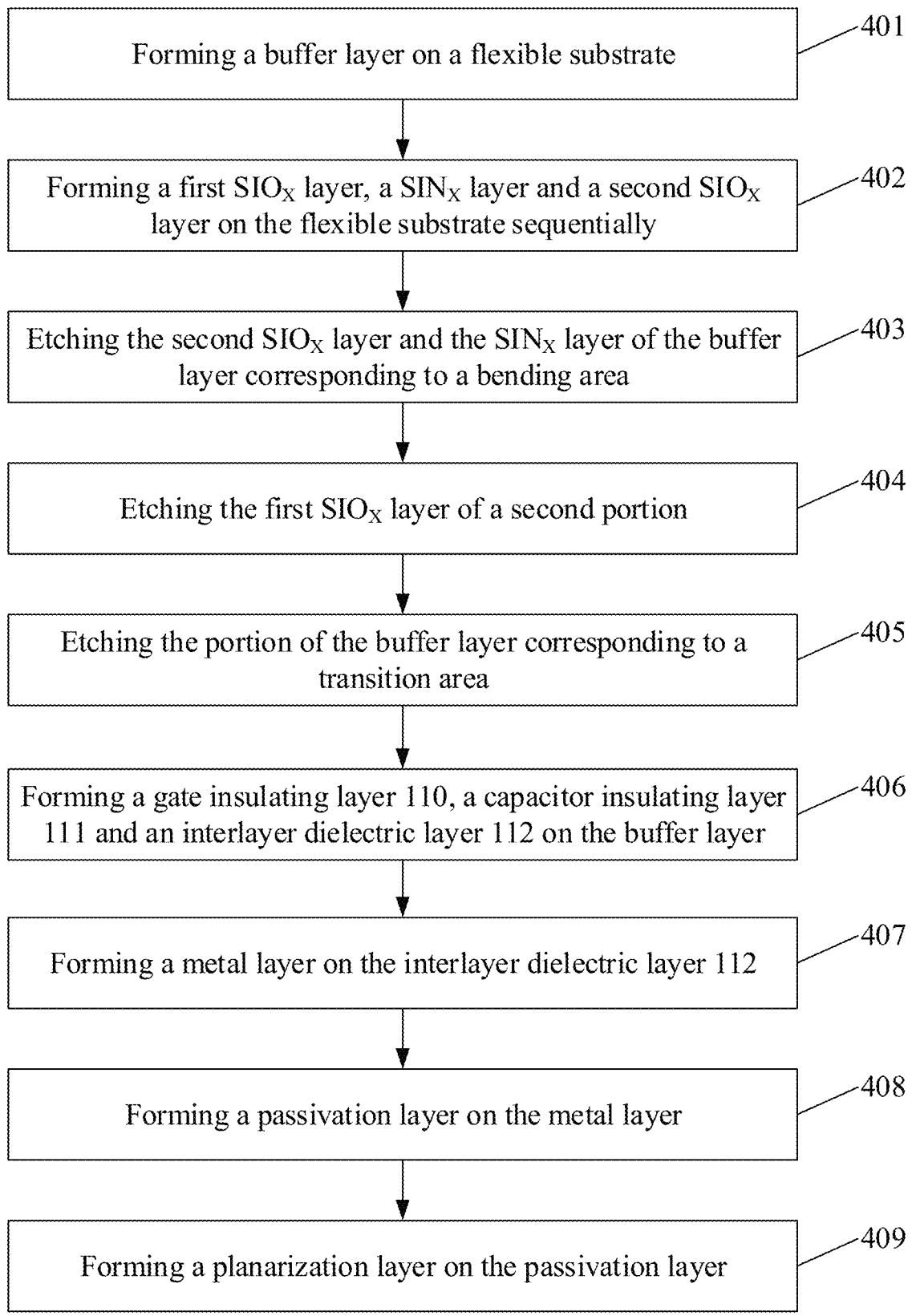
FIG. 4 is a schematic flow chart of a manufacturing method of a flexible display panel according to another embodiment of the present application.

FIG. 4 is a schematic flow chart of a manufacturing method of a flexible display panel according to another embodiment of the present application. The manufacturing method of FIG. 4 is an example of the manufacturing method of FIG. 3, and is for preparing the flexible display panel of the embodiments of FIG. 1 and FIG. 2. The manufacturing method of FIG. 4 includes the following contents.

401: forming a buffer layer on a flexible substrate.

402: forming a first $SIO_x$ layer, a SINx layer and a second $SIO_x$ layer on the entire flexible substrate successively.

403: etching the second $SIO_x$ layer and the SINx layer of the buffer layer corresponding to a bending area to expose a first $SIO_x$ layer of the second portion.

404: etching the first $SIO_x$ layer of the second portion, till the thickness of the first $SIO_x$ layer of the second portion is less than or equal to the thickness of the first $SIO_x$ layer of the first portion.

405: etching the portion of the buffer layer corresponding to a transition area to obtain a third portion which gradually decreases in width in a direction from the flexible substrate toward the metal layer.

406: forming a gate insulating layer 110, a capacitor insulating layer 111 and an interlayer dielectric layer 112 on the buffer layer.

407: forming a metal layer on the interlayer dielectric layer 112. That is, the metal layer may cover the interlayer dielectric layer 112 and the second portion and the third portion of the buffer layer.

408: forming a passivation layer on the metal layer.

409: forming a planarization layer on the passivation layer.

It should be understood that 408 and 409 are optional. The planarization layer and the passivation layer are made of organic materials. The buffer layer may be made of, for example, an inorganic insulating material. For example, the inorganic insulating material may be inorganic silicon material, and specifically may be silicon nitride, silicon oxide or the like. In general, when the inorganic silicon material is used for the buffer layer, for example, metal lines breakage in the metal layer is easily caused when the flexible display panel is bent. In general, the thinner the thickness of the buffer layer of the bending area, the stronger the bending ability of the metal layer of the bending area. When the thickness of the buffer layer of the bending area is very small, the metal layer of the bending area is located between organic layers, and a risk of the metal layer of the bending area being broken is greatly reduced when being bent. At the same time, a thinner inorganic layer may prevent the organic material from contaminating a chamber when etching and depositing. The bending ability of the bending area of a flexible screen body may be increased by reducing the thickness of the buffer layer of the bending area. In addition, the buffer layer of the bending area is etched before the metal layer is deposited, which is a relatively simple manufacturing process, and accordingly to save cost.

The above descriptions are merely preferred embodiments of the present application, but not intended to limit the present application. Any modification and equivalent replacement made without departing from the spirit and principle of the present application shall fall within the protection scope of the present application.

What is claimed is:

1. A flexible display panel, comprising:
    a flexible substrate;
    a buffer layer formed on the flexible substrate, the buffer layer comprising a first portion and a second portion; and
    a metal layer formed on the buffer layer,
    wherein the flexible display panel comprises a display area and a bending area in a lateral direction, the first portion of the buffer layer corresponds to the display area, the second portion of the buffer layer corresponds to the bending area, and a thickness of the second portion of the buffer layer is less than a thickness of the first portion.

2. The flexible display panel according to claim 1, wherein the first portion of the buffer layer comprises a first $SIO_x$ layer, a SINx layer and a second $SIO_x$ layer successively disposed, the first $SIO_x$ layer is disposed on the flexible substrate, and the second portion comprises the first $SIO_x$ layer.

3. The flexible display panel according to claim 2, wherein the second portion of the buffer layer does not comprise the SINx layer or the second $SIO_x$ layer.

4. The flexible display panel according to claim 2, wherein a thickness of the first $SIO_x$ layer of the second portion is less than or equal to a thickness of the first $SIO_x$ layer of the first portion.

5. The flexible display panel according to claim 1, wherein the flexible display panel further comprises a transition area in the lateral direction, the transition area is located between the display area and the bending area, the buffer layer further comprises a third portion corresponding to the transition area, and the third portion gradually decreases in width in a direction from the flexible substrate toward the metal layer.

6. The flexible display panel according to claim 1, wherein the flexible display panel further comprises a planarization layer and a passivation layer formed between the planarization layer and the metal layer.

7. The flexible display panel according to claim 6, wherein the passivation layer and the planarization layer are made of organic materials, the buffer layer is made of an inorganic insulating material.

8. The flexible display panel according to claim 1, wherein the thickness of the first portion is from 300 nm to 1400 nm, and the thickness of the second portion is from 10 nm to 100 nm.

9. The flexible display panel according to claim 1, wherein the thickness of the second portion is from 10 nm to 30 nm.

10. The flexible display panel according to claim 5, wherein a thickness of the third portion is from 300 nm to 700 nm.

11. The flexible display panel according to claim 1, wherein the metal layer comprises metal lines.

12. A manufacturing method, for manufacturing a flexible display panel comprising a display area and a bending area in a lateral direction, comprising:
    providing a flexible substrate;
    forming a buffer layer on the flexible substrate;
    defining the portion of the buffer layer corresponding to the display area as a first portion, etching the portion of the buffer layer corresponding to the bending area to obtain a second portion, and making a thickness of the second portion to be less than a thickness of the first portion; and
    forming a metal layer on the buffer layer.

13. The manufacturing method according to claim 12, wherein the forming a buffer layer on the flexible substrate comprises:
    forming a first $SIO_x$ layer, a SINx layer and a second $SIO_x$ layer successively on the flexible substrate,
    wherein the etching the portion of the buffer layer corresponding to the bending area to obtain a second portion comprises:
    etching the second $SIO_x$ layer and the SINx layer of the buffer layer corresponding to the bending area to expose the first $SIO_x$ layer of the second portion.

14. The manufacturing method according to claim 13, wherein after the etching the second $SIO_x$ layer and the SINx layer of the buffer layer corresponding to the bending area to expose the first $SIO_x$ layer of the second portion, the manufacturing method further comprises:
    further etching the first $SIO_x$ layer of the second portion, till a thickness of the first $SIO_x$ layer of the second portion is less than or equal to a thickness of the first $SIO_x$ layer of the first portion.

15. The manufacturing method according to claim 12, wherein the flexible display panel further comprises a transition area in the lateral direction, the transition area is located between the display area and the bending area, the manufacturing method further comprises:
    etching the portion of the buffer layer corresponding to the transition area to obtain a third portion, wherein the third portion gradually decreases in width in a direction from the flexible substrate toward the metal layer.

16. The manufacturing method according to claim 12, wherein the thickness of the second portion is from 10 nm to 30 nm.

17. The manufacturing method according to claim 12, further comprising: forming a passivation layer on the metal layer, and forming a planarization layer on the passivation layer.

18. The manufacturing method according to claim 17, wherein the passivation layer and the planarization layer are made of organic materials, and the buffer layer is made of an inorganic insulating material.

19. The manufacturing method according to claim 15, wherein a thickness of the third portion is from 300 nm to 700 nm.

20. The manufacturing method according to claim 12, wherein the metal layer comprises metal lines.

* * * * *